(12) United States Patent
Chen

(10) Patent No.: US 12,004,388 B2
(45) Date of Patent: Jun. 4, 2024

(54) FLEXIBLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yong Chen, Wuhan (CN)

( * ) Notice: Subject to any disclaimer, the term of this patent is extended or adjusted under 35 U.S.C. 154(b) by 796 days.

(21) Appl. No.: 17/264,859

(22) PCT Filed: Oct. 23, 2020

(86) PCT No.: PCT/CN2020/123061
§ 371 (c)(1),
(2) Date: Feb. 1, 2021

(87) PCT Pub. No.: WO2022/036843
PCT Pub. Date: Feb. 24, 2022

(65) Prior Publication Data
US 2022/0399425 A1    Dec. 15, 2022

(30) Foreign Application Priority Data
Aug. 20, 2020   (CN) .......................... 202010845793.2

(51) Int. Cl.
*H01L 27/32*   (2006.01)
*H10K 50/84*   (2023.01)
*H10K 59/131*   (2023.01)
*H10K 102/00*   (2023.01)

(52) U.S. Cl.
CPC .......... *H10K 59/131* (2023.02); *H10K 50/84* (2023.02); *H10K 2102/311* (2023.02)

(58) Field of Classification Search
None
See application file for complete search history.

(56) References Cited

U.S. PATENT DOCUMENTS

2022/0399425 A1* 12/2022 Chen ...................... H10K 50/85

FOREIGN PATENT DOCUMENTS

| CN | 104808843 A | 7/2015 |
|---|---|---|
| CN | 109272876 A | 1/2019 |
| CN | 110189631 A | 8/2019 |
| CN | 110870001 A | 3/2020 |
| CN | 111161644 A | 5/2020 |
| CN | 111326073 A | 6/2020 |
| JP | 2014132319 A | 7/2014 |

* cited by examiner

*Primary Examiner* — Jack S Chen

(57) ABSTRACT

A flexible display panel and a display device are disclosed. An opening hole is defined in a corner splicing section of the flexible display panel and is filled with a splicing element formed by filling a light guide material, and a light guide layer is disposed on one side of a display surface of the flexible display panel at a same time. Therefore, the flexible display panel and the display device of the present disclosure can prevent wrinkle phenomena and realize normal light emission in the corner splicing section.

20 Claims, 5 Drawing Sheets

FLEXIBLE DISPLAY PANEL AND DISPLAY DEVICE

CROSS REFERENCE TO RELATED APPLICATIONS

The present application claims priority of the Chinese patent application No. CN202010845793.2 filed on Aug. 20, 2020 with the National Intellectual Property Administration, titled "Flexible display panel and display device", which is incorporated by reference in the present application in its entirety.

FIELD OF INVENTION

The present disclosure relates to the field of display technologies, and more particularly, to a flexible display panel and a display device.

BACKGROUND OF INVENTION

With continuous development of technology, requirements for display devices are getting higher. As commonly known, organic light-emitting diode (OLED) display devices have received widespread attention due to a lot of advantages thereof, such as narrow bezels, lightweightness, rollability, and ease of portability.

At present, various special and novel designs for mobile devices such as mobile phones are continuously developed, and "full screen" designs have become a mainstream. Dual curved edge display design has shown up in the market now, the design is novel and beautiful, and it is easier to achieve "full screen" effect. However, products using technology for four curved sides and realizing curved edge display have not emerged. If the above design of four curved sides and curved edge display can be realized, the full screen effect would be more prominent, a screen ratio would be greatly improved, and practicality and aesthetics would be also improved. It can be known that four-sided curved display of flexible displays are important development trends for the field of display technologies.

FIG. 1 is a schematic diagram of a conventional display panel. As shown in FIG. 1, if four-sided curved display is performed using the conventional display panel, a curved surface is formed along axis positions of a bending line X and a bending line Y shown in FIG. 1. Therefore, "wrinkle phenomena" will occur in a display area 11 or a non-display area 12 of intersected positions of the bending line X and the bending line Y (that is, positions of four fillets). The "wrinkle phenomena" will not only cause fillet areas to lose display function but also make film layers in the intersected positions peel easily due to inability to release stresses, which will result in encapsulation failure and water and oxygen intrusion, thereby losing functionality. In addition, normal display function cannot be realized around the above four fillets.

Therefore, it is necessary to provide a flexible display panel and a display device that can realize four-sided curved display to solve the above technical problems.

Technical problem: in order to solve the above problems, the present disclosure provides a flexible display panel and a display device by defining an opening hole in a corner splicing section, filling a splicing element formed by filling a light guide material in the opening hole, and disposing a light guide layer. Therefore, the wrinkle phenomena can be prevented, and normal light emission in the corner splicing section can be realized.

SUMMARY OF INVENTION

In order to realize the above objectives, a flexible display panel and a display device of the present disclosure use following technical solutions.

The present disclosure provides a flexible display panel having a display area, wherein, the display area includes a planar section and at least one corner splicing section positioned in a periphery of the planar section, and the corner splicing section surrounds a corner of the planar section;

the display area further includes a first curved section and a second curved section positioned in the periphery of the planar section, and the first curved section and the second curved section are positioned on sides of the corner;

the corner splicing section includes a first splicing subsection, a second splicing subsection, and an opening hole penetrating through upper and lower surfaces of the flexible display panel, wherein the opening hole passes through the corner splicing section along a direction away from the planar section and is filled with a splicing element formed by a light guide material, the first splicing subsection is positioned between the first curved section and the splicing element and connected to the first curved section, and the second splicing subsection is positioned between the second curved section and the splicing element and connected to the second curved section; and the flexible display panel includes an array substrate, a plurality of light-emitting devices, and a light guide layer, wherein the light guide layer is disposed on one side of the array substrate facing a display surface of the flexible display panel and covers the display area, and the light-emitting devices are disposed on a surface of the array substrate facing the light guide layer and positioned in the display area excluding the corner splicing section.

Further, the corner splicing section further includes a first splicing subsection and a second splicing subsection, the first splicing subsection is positioned between the first curved section and the splicing element and connected to the first curved section, and the second splicing subsection is positioned between the second curved section and the splicing element and connected to the second curved section.

Further, the first splicing subsection is provided with VSS wirings, and the second splicing subsection is provided with the VSS wirings and gate driver on array (GOA) wirings.

Further, the flexible display panel further includes a first bezel area and a second bezel area; the first bezel area is positioned on one side of the first curved section away from the planar section and provided with VSS wirings and gate driver on array (GOA) wirings; and the second bezel area is positioned on one side of the second curved section away from the planar section and provided with the VSS wirings.

The present disclosure provides a flexible display panel having a display area, wherein the display area includes a planar section and at least one corner splicing section positioned in a periphery of the planar section, and the corner splicing section surrounds a corner of the planar section; wherein the corner splicing section is provided with an opening hole penetrating through upper and lower surfaces of the flexible display panel, and the opening hole passes through the corner splicing section along a direction away from the planar section and is filled with a splicing element formed by a light guide material; and the flexible display panel further includes a light guide layer disposed on one side of a display surface of the flexible display panel and covering the display area.

Further, the flexible display panel includes an array substrate and a plurality of light-emitting devices disposed on a surface of the array substrate facing the light guide layer; wherein, the light-emitting devices are disposed in the display area excluding the corner splicing section.

Further, the display area further includes a first curved section and a second curved section positioned in the periphery of the planar section, and the first curved section and the second curved section are positioned on sides of the corner and respectively connected to the corner splicing section.

Further, the corner splicing section further includes a first splicing subsection and a second splicing subsection, the first splicing subsection is positioned between the first curved section and the splicing element and connected to the first curved section, and the second splicing subsection is positioned between the second curved section and the splicing element and connected to the second curved section.

Further, the first splicing subsection is provided with VSS wirings, and the second splicing subsection is provided with the VSS wirings and gate driver on array (GOA) wirings.

Further, the flexible display panel further includes a first bezel area and a second bezel area; the first bezel area is positioned on one side of the first curved section away from the planar section and provided with VSS wirings and gate driver on array (GOA) wirings; and the second bezel area is positioned on one side of the second curved section away from the planar section and provided with the VSS wirings.

The present disclosure further provides a display device, which includes a flexible display panel having a display area, wherein, the display area includes a planar section and at least one corner splicing section positioned in a periphery of the planar section, and the corner splicing section surrounds a corner of the planar section; wherein the corner splicing section is provided with an opening hole penetrating through upper and lower surfaces of the flexible display panel, and the opening hole passes through the corner splicing section along a direction away from the planar section and is filled with a splicing element formed by a light guide material; and the flexible display panel further includes a light guide layer disposed on one side of a display surface of the flexible display panel and covering the display area.

Further, the flexible display panel includes an array substrate and a plurality of light-emitting devices disposed on a surface of the array substrate facing the light guide layer; wherein, the light-emitting devices are disposed in the display area excluding the corner splicing section.

Further, the display area further includes a first curved section and a second curved section positioned in the periphery of the planar section, and the first curved section and the second curved section are positioned on sides of the corner and respectively connected to the corner splicing section.

Further, the corner splicing section further includes a first splicing subsection and a second splicing subsection, the first splicing subsection is positioned between the first curved section and the splicing element and connected to the first curved section, and the second splicing subsection is positioned between the second curved section and the splicing element and connected to the second curved section.

Further, the first splicing subsection is provided with VSS wirings, and the second splicing subsection is provided with the VSS wirings and gate driver on array (GOA) wirings.

Further, the flexible display panel further includes a first bezel area and a second bezel area; the first bezel area is positioned on one side of the first curved section away from the planar section and provided with VSS wirings and gate driver on array (GOA) wirings; and the second bezel area is positioned on one side of the second curved section away from the planar section and provided with the VSS wirings.

Further, the display device further includes a bonded substrate disposed on one side of the display panel facing away from the display surface and matching a shape of the flexible display panel; wherein the splicing element is in contact with a surface of the bonded substrate.

Further, the display device further includes a cover plate disposed on one side of the light guide layer facing away from the flexible display panel and matching a shape of the flexible display panel.

Further, the display device further includes a first optical adhesive layer disposed between the light guide layer and the cover plate and covering the light guide layer.

Further, the display device further includes a touch control functional layer disposed between the first optical adhesive layer and the cover plate and covering the first optical adhesive layer.

Further, the display device further includes a polarizing layer disposed between the touch control functional layer and the cover plate and covering the touch control functional layer.

Beneficial effect: the flexible display panel and the display device of the present disclosure have following beneficial effects:

(1) Bending stresses of the display panel (for example, the first curved section and the second curved section) will not be in the display area or bezel area but outside of the display panel by defining the opening hole in the corner splicing section. Therefore, wrinkle phenomena in the corner splicing section can be prevented when curved cover glass (CG) attachment is performed during module processes.

(2) A number of wirings in the bezel area and a width of the bezel area can be reduced by respectively disposing the VSS wirings or the GOA wirings in the first splicing subsection and the second splicing subsection.

(3) Light emitted from the display area can be transported by filling the splicing element formed by the light guide material in the opening hole and cooperation of the light guide layer, thereby allowing normal light emission in the corner splicing section and creating ideal display effect on four-sided curved surfaces.

(4) The flexible display panel and the display device having the flexible display panel of the present disclosure have a reasonable structure and can realize curved edge display, thereby realizing four-sided curved display of flexible displays and full-screen display effect.

DETAILED DESCRIPTION OF PREFERRED EMBODIMENTS

The present disclosure provides a flexible display panel and a display device. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

Figure 1:
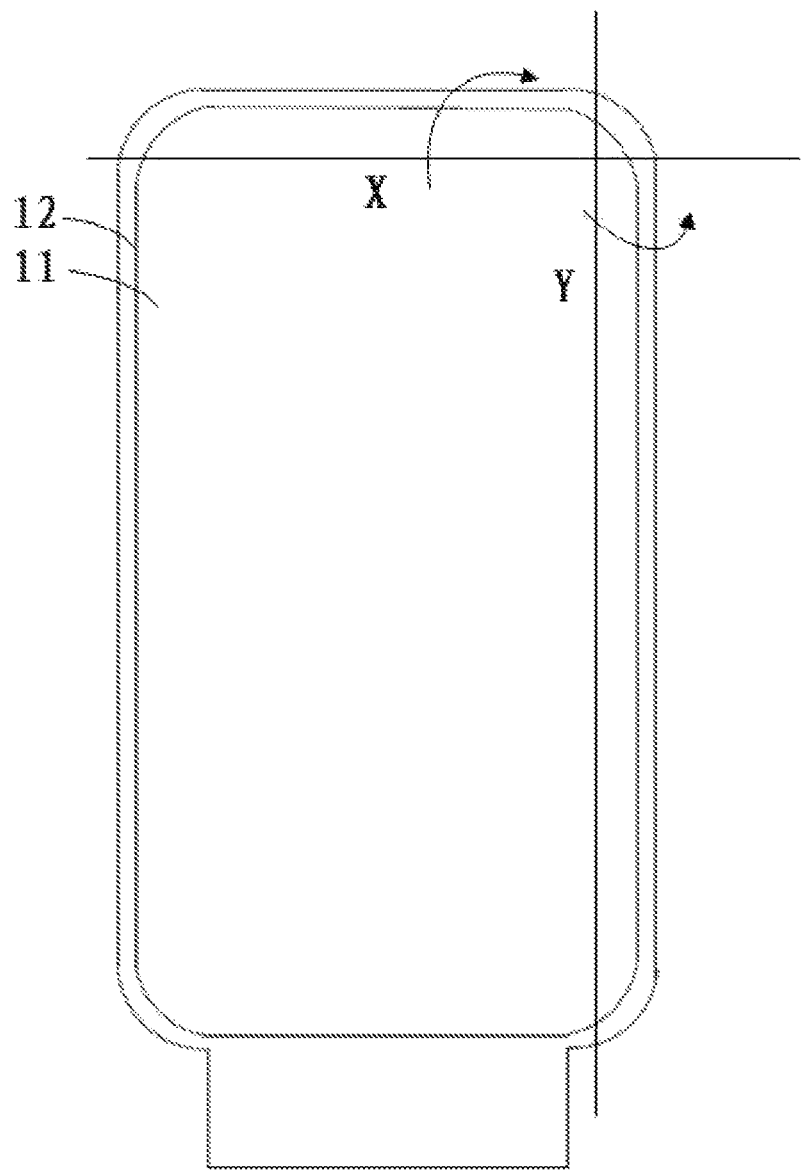
FIG. 1 is a schematic diagram of a conventional display panel.
Figure 2:
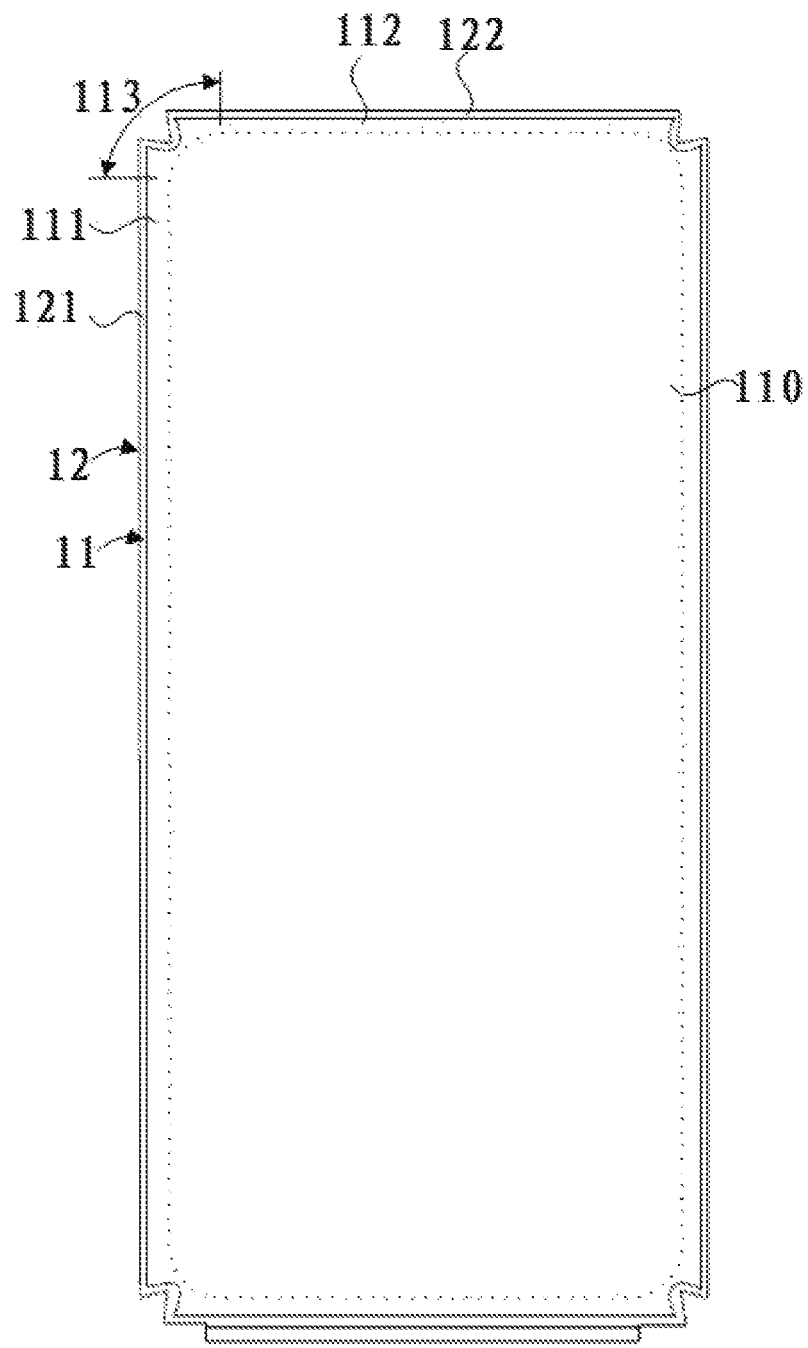
FIG. 2 is a schematic diagram of a display panel in an expanded state according to an embodiment of the present disclosure.
Figure 3:
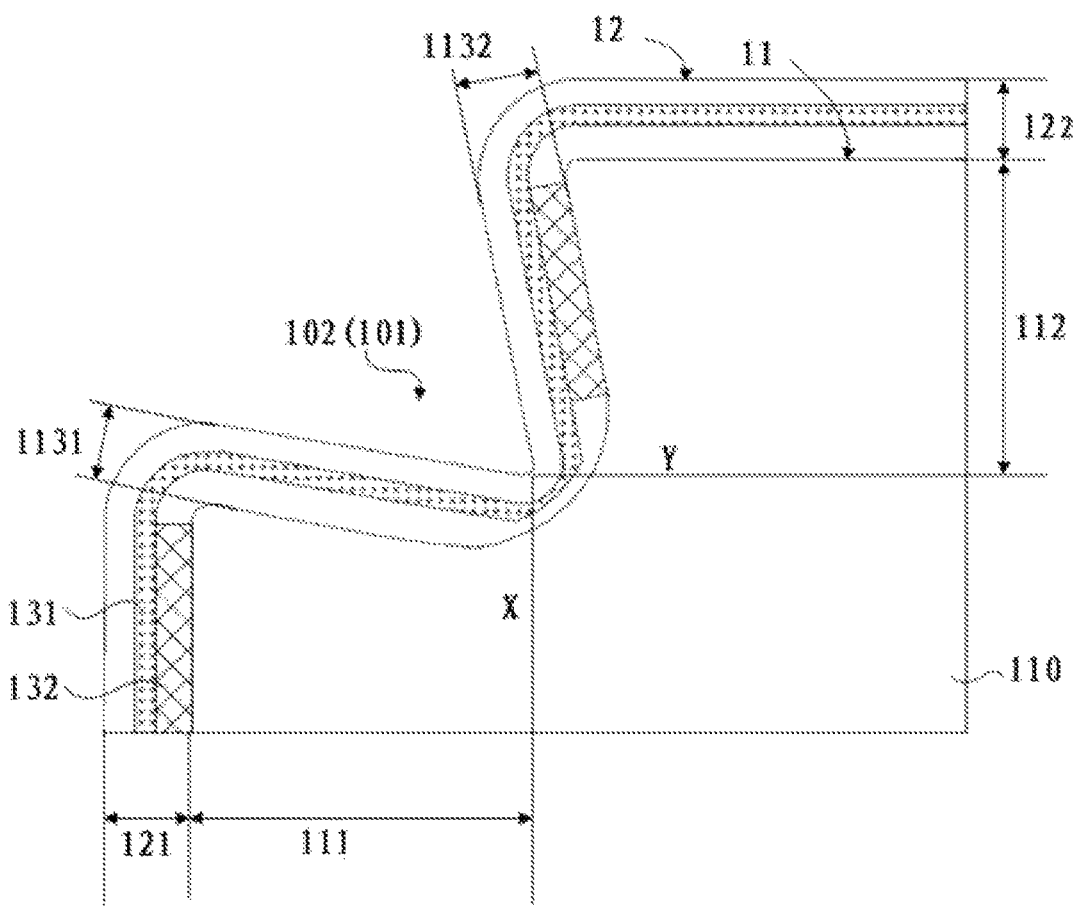
FIG. 3 is a schematic partial enlarged diagram of the display panel according to an embodiment of the present disclosure.
Figure 4:
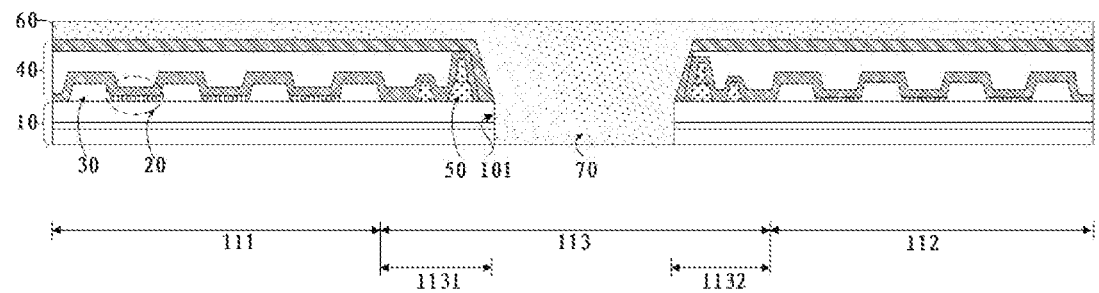
FIG. 4 is a schematic cross-sectional diagram of the display panel in a splicing state according to an embodiment of the present disclosure.

FIG. 2 is a schematic diagram of a display panel in an expanded state according to an embodiment of the present disclosure, FIG. 3 is a schematic partial enlarged diagram of the display panel according to an embodiment of the present disclosure, and FIG. 4 is a schematic cross-sectional diagram of the display panel in a splicing state according to an embodiment of the present disclosure. As shown in FIGS. 2, 3, and 4, the present disclosure provides a flexible display panel 1, which includes a display area 11 and a bezel area 12 positioned in a periphery of the display area.

A type of the flexible display panel 1 is not limited herein, it may be a liquid crystal display (LCD), an organic light-emitting diode (OLED) display, or a quantum dot light-emitting diode (QLED) display panel. A number of the bezel area 12 is also not limited here. In order to reduce bezels of the flexible display panel 1 in a greater degree, generally, only one bezel area 12 is necessary to be defined in the display panel to meet requirements. Taking the flexible display panel 1 being rectangular as an example, one, two, three, or four edge areas of the flexible display panel 1 may be bent to a back surface of the display area 11. The flexible display panel 1 may be a four-sided curved display panel having four edge areas all bent to one side of the display area 11 facing away from a display surface.

In some embodiments, the display area 11 of the flexible display panel 1 can display pictures, and the displayed pictures can actually be seen by users.

As shown in FIG. 2, the display area 11 includes a planar section 110 and a first curved section 111, a second curved section 112, and a corner splicing section 113 positioned in peripheries of the planar section 110.

Please continue to refer to FIG. 2, the corner splicing section 113 surrounds a corner of the planar section 110, and the first curved section 111 and the second curved section 112 surround two sides of the corner respectively. Or it can be said that the first curved section 111 and the second curved section 112 are positioned on adjacent sides of the planar section 110, and the corner splicing section 113 is positioned in an intersected position of the first curved section 111 and the second curved section 112 and is connected to the first curved section 111 and the second curved section 112 respectively.

Specifically, the planar section 110 may be planar. In a specific embodiment, the planar section 110 may have a plurality of sides and a plurality of corners. Specifically, the corner may be a fillet.

It should be noted that a shape of the planar section 110, a number or a shape of the corners of the planar section 110, and a number of the sides of the planar section 110 are not limited in the present disclosure. For example, in this embodiment, the planar section 110 is a rectangle having four fillets, and at this time, the flexible display panel 1 can be a four-sided curved display panel.

As shown in FIGS. 2 and 3, the first curved section 111 is positioned in the peripheries of the planar section 110 and is bent along a first bending line X toward a non-display surface of the display area 11. Specifically, the first curved section 111 is curved or arc-shaped.

As shown in FIGS. 2 and 3, the second curved section 112 is positioned in the peripheries of the planar section 110 and is bent along a first bending line Y toward a non-display surface of the display area 11. Specifically, the second curved section 112 is curved or arc-shaped.

As shown in FIGS. 2 and 3, the corner splicing section 113 is positioned in the intersected position of the first curved section 111 and the second curved section 112 and is smoothly connected to the first curved section 111 and the second curved section 112 respectively. That is, the first curved section 111, the corner splicing section 113, and the second curved section 112 are smoothly connected in sequence to constitute a smooth arc structure.

Specifically, the corner splicing section 113 is smoothly curved or arc-shaped, and the corner splicing section 113, the first curved section 111, and the second curved section 112 are bent in a same direction. That is, the corner splicing section 113 is also bent toward the non-display surface of the display area 11.

As shown in FIGS. 2, 3, and 4, an opening hole 101, a first splicing subsection 1131, a second splicing subsection 1132, and a splicing element 70 filled in the opening hole are provided in the corner splicing section 113.

As shown in FIGS. 2, 3, and 4, the opening hole 101 penetrates through upper and lower surfaces of the display panel 1 and passes through the corner splicing section 113 along a direction away from the planar section 110. Or it can be said that the opening hole 101 divides the corner splicing section 113 into two subsections along the direction away from the planar section 110, that is, the first splicing subsection 1131 and the second splicing subsection 1132.

As shown in FIG. 3, the first splicing subsection 1131 and the second splicing subsection 1132 are connected to each other toward one end of the planar section 110, and the opening hole 101 is positioned on one side of the first splicing subsection 1131 and the second splicing subsection 1132 away from the planar section 110.

Obviously, bending stresses of the first curved section 111 and the second curved section 112 will not be in the display area 11 or the bezel area 12 but outside of the display panel by defining the opening hole 101. Therefore, wrinkle phenomena can be prevented when curved cover glass (CG) attachment is performed during module processes.

As shown in FIG. 3, when the display panel 1 is expanded, an opening area 102 between the first splicing subsection 1131 and the second splicing subsection 1132 is the opening hole 101 in the expanded state. Or it can be said that the opening area 102 is a removing area or an etching area that is used to form the opening hole 101 subsequently. That is, during a manufacturing process of the display panel 1, it requires to remove the opening area 102 to form the opening hole 101 subsequently.

As shown in FIG. 3, a width of the opening area 102 is getting larger along the direction away from the planar section 110.

As shown in FIGS. 3 and 4, the first splicing subsection 1131 is positioned on one side of the first curved section 111 adjacent to the opening area 102 and connected to the first curved section 111. In addition, the first splicing subsection 1131 is provided with VSS wirings 131.

As shown in FIGS. 3 and 4, the second splicing subsection 1132 is positioned on one side of the second curved section 112 toward the opening area 102 and connected to the second curved section 112. In addition, the second splicing subsection 1132 is provided with the VSS wirings 131 and gate driver on array (GOA) wirings 132.

In a specific embodiment, the first splicing subsection 1131 and the second splicing subsection 1132 are respectively connected to the splicing element 70 filled in the opening hole 101.

A number of wirings in the bezel area 12 can be reduced by disposing the VSS wirings 131 and the GOA wirings 132 in the first splicing subsection 1131 and the second splicing subsection 1132. Therefore, a width of the peripheries can be reduced, thereby being beneficial for realizing narrow bezels.

As shown in FIG. 4, the first splicing subsection 1131 and the second splicing subsection 1132 are not provided with light-emitting devices 20 but provided with the VSS wirings 131, the GOA wirings 132, an encapsulation layer 40, a pixel definition layer 30, and retaining walls 50. The light-emitting devices 20 are not disposed in the first splicing subsection 1131 or the second splicing subsection 1132.

As shown in FIG. 4, the splicing element 70 is filled in the opening hole 101 and in contact with the first splicing subsection 1131 and the second splicing subsection 1132.

Obviously, light emitted from the display area 11 can be transported by disposing the splicing element 70 which has light guiding property, thereby allowing normal light emission in the corner splicing section 113, especially in the opening hole 101, and creating ideal display effect on four-sided curved surfaces.

In a specific embodiment, the splicing element 70 is formed by a light guide material. The light guide material may be, but is not limited to, polycarbonate or polymethylmethacrylate.

In a specific embodiment, the splicing element 70 formed by the light guide material may be solely formed or may be obtained from a step forming a light guide layer 60.

As shown in FIG. 2, the bezel area 12 includes a first bezel area 121 and a second bezel area 122. Wherein, the first bezel area 121 is positioned on one side of the first curved section 111 away from the planar section 110 and provided with the VSS wirings 131 and the GOA wirings 132, and the second bezel area 122 is positioned on one side of the second curved section 112 away from the planar section 110 and provided with the VSS wirings 131. In addition, the VSS wirings 131 are disposed extending in the first bezel area 121, the first splicing subsection 1311, the second splicing subsection 1312, and the second bezel area 122.

It should be noted that a specific number of the bezel area 12 is not limited in the present disclosure. For example, in this embodiment, the bezel area 12 is disposed in peripheries of the display area 11 and surrounds the display area 11. In other embodiments, the bezel area 12 may also be disposed only on one side of the display area 11.

Specifically, the GOA wirings 132 in the bezel area 12 surround the display area 11.

As shown in FIG. 4, the display panel 1 of the present disclosure includes an array substrate 10, the light-emitting devices 20, the pixel definition layer 30, the encapsulation layer 40, the retaining walls 50, and the light guide layer 60 stacked in sequence along a thickness direction thereof.

Specifically, the opening hole 101 extends from the encapsulation layer 40 to the array substrate 10 and is filled with the splicing element 70 formed by the light guide material.

As shown in FIG. 3, the array substrate 10 includes a base substrate, a plurality of insulating layers disposed on the base substrate, and a plurality of metal layers and a semiconductor layer stacked among the insulating layers.

Wherein, the insulating layers may include a buffer layer, a gate insulating layer, an interlayer insulating layer, and a planarization layer. The metal layers include a gate electrode metal layer and a source and drain electrode metal layer. In other embodiments, the metal layers may also include a pixel electrode layer.

Specifically, the insulating layers, and the metal layers and the semiconductor layer disposed among the insulating layers may be used to constitute thin film transistors. The thin film transistors and metal wirings are manufactured by avoiding a cutting area and cutting peripheral areas of the opening hole 101.

Specifically, the thin film transistors can be used for switching or driving. A type or a structure of the thin film transistors is not limited in the present disclosure, and it can be changed or selected according to actual display requirements.

As shown in FIG. 4, the retaining walls 50 are disposed on the array substrate 10 and surrounding peripheries of the opening hole 101. Alternatively, the retaining walls 50 may be disposed on a same layer with the pixel definition layer 30. Alternatively, the retaining walls 50 may also be disposed on a same layer with one or multiple layers of the insulating layers. In this way, when depositing a water blocking layer, the inorganic water blocking layer and the retaining walls will form a dam structure which can prevent water and oxygen. That is, the retaining walls 50 in this embodiment can be used as dams for blocking water and oxygen, thereby preventing the light-emitting devices 20 from being eroded by water and oxygen.

Specifically, the retaining walls 50 are disposed in the first splicing subsection 1131 or the second splicing subsection 1132 toward the opening hole 101.

In a specific embodiment, a first retaining wall and a second retaining wall having different heights can be disposed.

As shown in FIG. 4, the pixel definition layer 30 is disposed on a surface of the array substrate 10 and has a plurality of pixel apertures. The pixel apertures are configured to limit the light-emitting devices 20.

In this embodiment, at least a part of areas of the pixel definition layer 30 is filled in the first splicing subsection 1131 and the second splicing subsection 1132.

In a specific embodiment, for example, the pixel definition layer 30 can be formed by coating an organic photosensitive material such as a polyimide resin or an acrylic rein, and then performing exposure and developing processes. In some embodiments, the pixel definition layer 30 can be formed of a polymer material or an inorganic material by printing (such as inkjet printing).

As shown in FIG. 3, the light-emitting devices 20 are disposed on one side of the array substrate 10 provided with the pixel definition layer 30 and in the display area 11, and more specifically, the light-emitting devices 20 are disposed in the pixel apertures.

The light-emitting devices 20 are disposed in the display area 11 excluding the corner splicing section 113. That is, the corner splicing section 113 is not provided with the light-emitting devices 20.

As shown in FIG. 4, the light-emitting devices 20 includes anodes, a light-emitting functional layer, and cathodes stacked on the array substrate 10 in sequence.

Wherein, the anodes are disposed independently corresponding to each of the light-emitting devices 20. The pixel apertures of the pixel definition layer 30 expose the anodes.

The light-emitting functional layer is formed on the anodes in an exposed area of the pixel apertures. The light-emitting functional layer is formed by an organic light-emitting material which can generate red light, blue light, or green light.

Wherein, the cathodes are a cathode layer collectively disposed corresponding to the light-emitting devices 20, and the cathode layer covers the light-emitting functional layer, the pixel definition layer 30, the retaining walls 50, and the array substrate 10. In other embodiments, the cathodes can be formed independently corresponding to each of the light-emitting devices 20.

As shown in FIG. 4, the encapsulation layer 40 is disposed on the light-emitting devices 20 and covers the array substrate 10 and the light-emitting devices 20, thereby preventing moisture or other outside pollutants from penetrating and entering the array substrate 10 and the light-emitting devices 20.

For example, in this embodiment, the encapsulation layer 40 is disposed on the cathode layer of the light-emitting devices 20.

Specifically, the encapsulation layer 40 extends to the opening hole 101. For example, as shown in FIG. 3, in this embodiment, the encapsulation layer 40 covers the cathodes and the array substrate 10.

Specifically, the encapsulation layer 40 may include a plurality of inorganic encapsulation layers and an organic encapsulation layer stacked alternatingly. In a specific embodiment, the inorganic encapsulation layers may include inorganic insulating materials, such as aluminum oxide, titanium oxide, tantalum oxide, hafnium oxide, zinc oxide, silicon oxide, silicon nitride, and/or silicon oxynitride, and may be formed by chemical vapor deposition (CVD). The organic encapsulation layer may include a polymer material. An example of the polymer material may include acrylic resin, epoxy resin, polyimide, and polyethylene.

As shown in FIG. 4, the light guide layer 60 is disposed on the encapsulation layer 40 and covers the encapsulation layer 40.

Specifically, a shape of the light guide layer 60 matches a shape of the display panel 1.

Specifically, the light guide layer 60 covers the display area 11.

In a specific embodiment, the light guide layer 60 is formed by the light guide material. The light guide material may be, but is not limited to, polycarbonate or polymethylmethacrylate.

It should be noted that a specific structure or a material of the light guide layer 60 is not limited in the present disclosure. For example, the light guide layer 60 may be a single layered film layer structure or a multi-layered film layer structure.

Figure 5:
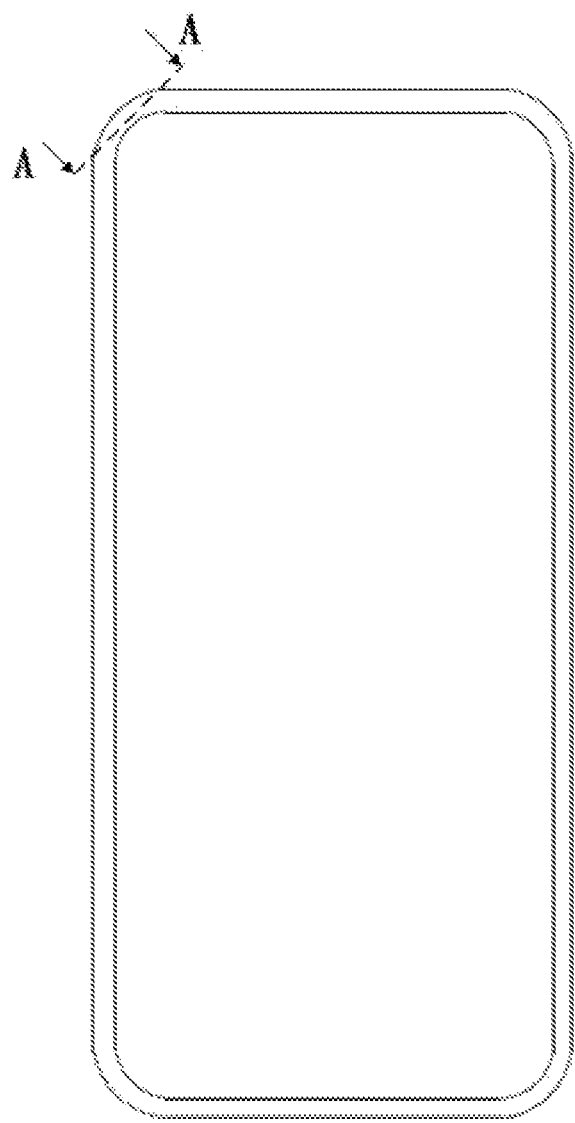
FIG. 5 is a schematic planar diagram of a display device according to an embodiment of the present disclosure.
Figure 6:
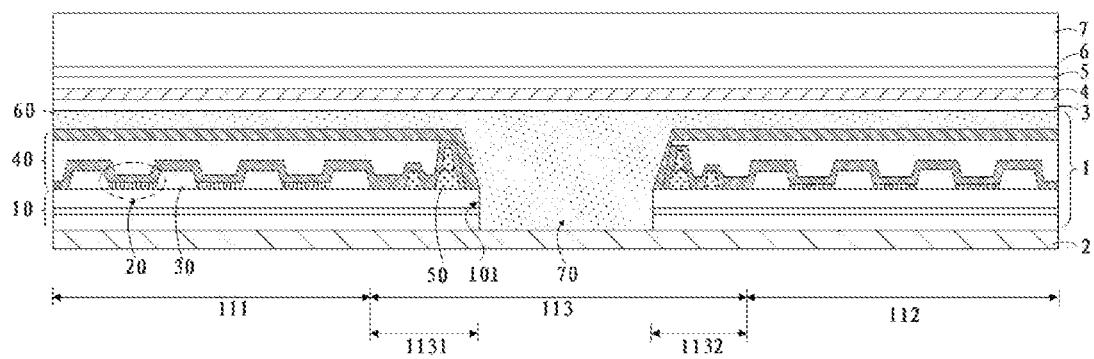
FIG. 6 is a schematic cross-sectional diagram of the display device according to an embodiment of the present disclosure.

FIG. 5 is a schematic planar diagram of a display device according to an embodiment of the present disclosure, and FIG. 6 is a schematic cross-sectional diagram of the display device along line A-A according to an embodiment of the present disclosure. As shown in FIGS. 5 and 6, the present disclosure further provides a display device, which includes the display panel 1 of the present disclosure. Wherein, a specific structure of the display panel 1 can be referred to the above description and will not be iterated herein for the sake of conciseness.

As shown in FIG. 6, the display device of the present disclosure further includes a bonded substrate 2, a first optical adhesive layer 3, a touch control functional layer 4, a polarizing layer 5, a second optical adhesive layer 6, and a cover plate 7.

As shown in FIG. 6, the first optical adhesive layer 3 is disposed on the light guide layer 60 of the display panel 1 and covers the light guide layer 60. In a specific embodiment, a shape of the first optical adhesive layer 3 matches and corresponds to the display panel 1.

In a specific embodiment, a material of the first optical adhesive layer 3 may be an optically clear adhesive (OCA). The OCA is a special adhesive used to bond transparent optical components and has advantages of colorless and transparent, light transmittance above 90%, excellent bonding strength, and having viscoelasticity.

As shown in FIG. 6, the touch control functional layer 4 is disposed on one side of the first optical adhesive layer 3 facing away from the light guide layer 60 and covers the first optical adhesive layer 3. Or it can be said that the touch control functional layer 4 is attached to the light guide layer 60 by the first optical adhesive layer 3. In a specific embodiment, the touch control functional layer 4 may be a conventional functional film layer module used for touch control, and it will not be iterated herein for the sake of conciseness.

As shown in FIG. 6, the polarizing layer 5 is disposed on a surface of the touch control functional layer 4 away from the light guide layer 60 and covers the touch control functional layer 4, and a shape of the polarizing layer 5 matches a shape of the light guide layer 60.

As shown in FIG. 6, the second optical adhesive layer 6 is disposed on the polarizing layer 5 and covers the polarizing layer 5. In a specific embodiment, a material of the second optical adhesive layer 6 may be an optically clear adhesive (OCA). The OCA is a special adhesive used to bond transparent optical components and has advantages of colorless and transparent, light transmittance above 90%, excellent bonding strength, and having viscoelasticity.

As shown in FIG. 6, the cover plate 7 is disposed on one side of the second optical adhesive layer 6 facing away from the polarizing layer 5 and covers the second optical adhesive layer 6. Or it can be said that the cover plate 7 is attached to the polarizing layer 5 by the second optical adhesive layer 6. In a specific embodiment, the cover plate 7 is a single layered or multi-layered stacked structure formed of a transparent glass or other transparent material.

In this embodiment, the cover plate 7 is a flexible cover plate. The flexible cover plate includes a flexible substrate and a hardened film layer stacked on one surface of the flexible substrate. The flexible substrate may be a polymer material such as PI, COP, or PET, and a thickness thereof is generally not greater than 50 μm, thereby ensuring the flexible cover plate to have better bending property. The hardened film layer is a layer of film structure deposited on one surface of the flexible substrate, and a thickness thereof is generally not greater than 10 μm. Strength of the flexible cover plate can be enhanced by the hardened film layer, thereby realizing drop-proof, wear-resistant, and waterproof properties of the flexible cover plate.

For example, in this embodiment, the cover plate 7 is a four-sided curved cover plate, that is, four sides of the cover plate 7 are all curved. The four-sided curved cover plate can be used to manufacture four-sided curved display screens or four-sided curved display devices. In other embodiments, the cover plate 7 may have other shapes.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A flexible display panel, having a display area comprising a planar section and at least one corner splicing section positioned in a periphery of the planar section, wherein the corner splicing section surrounds a corner of the planar section; wherein the display area further comprises a first curved section and a second curved section positioned in the periphery of the planar section, and the first curved section and the second curved section are positioned on sides of the corner;
the corner splicing section comprises a first splicing subsection, a second splicing subsection, and an opening hole penetrating through upper and lower surfaces of the flexible display panel, wherein the opening hole passes through the corner splicing section along a direction away from the planar section and is filled with a splicing element formed by a light guide material, the first splicing subsection is positioned between the first curved section and the splicing element and connected to the first curved section, and the second splicing subsection is positioned between the second curved section and the splicing element and connected to the second curved section; and
the flexible display panel comprises an array substrate, a plurality of light-emitting devices, and a light guide layer, wherein the light guide layer is disposed on one side of the array substrate facing a display surface of the flexible display panel and covers the display area, and the light-emitting devices are disposed on a surface of the array substrate facing the light guide layer and positioned in the display area excluding the corner splicing section.

2. The flexible display panel according to claim 1, wherein the first splicing subsection is provided with VSS wirings, and the second splicing subsection is provided with the VSS wirings and gate driver on array (GOA) wirings.

3. The flexible display panel according to claim 1, further comprising a first bezel area and a second bezel area;
wherein the first bezel area is positioned on one side of the first curved section away from the planar section and provided with VSS wirings and gate driver on array (GOA) wirings; and
the second bezel area is positioned on one side of the second curved section away from the planar section and provided with the VSS wirings.

4. A flexible display panel, having a display area comprising a planar section and at least one corner splicing section positioned in a periphery of the planar section, wherein the corner splicing section surrounds a corner of the planar section; wherein the corner splicing section is provided with an opening hole penetrating through upper and lower surfaces of the flexible display panel, and the opening hole passes through the corner splicing section along a direction away from the planar section and is filled with a splicing element formed by a light guide material; and
the flexible display panel further comprises a light guide layer disposed on one side of a display surface of the flexible display panel and covering the display area.

5. The flexible display panel according to claim 4, comprising an array substrate and a plurality of light-emitting devices disposed on a surface of the array substrate facing the light guide layer;
wherein the light-emitting devices are disposed in the display area excluding the corner splicing section.

6. The flexible display panel according to claim 4, wherein the display area further comprises a first curved section and a second curved section positioned in the periphery of the planar section, and the first curved section and the second curved section are positioned on sides of the corner and respectively connected to the corner splicing section.

7. The flexible display panel according to claim 6, wherein the corner splicing section further comprises a first splicing subsection and a second splicing subsection, the first splicing subsection is positioned between the first curved section and the splicing element and connected to the first curved section, and the second splicing subsection is positioned between the second curved section and the splicing element and connected to the second curved section.

8. The flexible display panel according to claim 7, wherein the first splicing subsection is provided with VSS wirings, and the second splicing subsection is provided with the VSS wirings and gate driver on array (GOA) wirings.

9. The flexible display panel according to claim 6, further comprising a first bezel area and a second bezel area;
wherein the first bezel area is positioned on one side of the first curved section away from the planar section and provided with VSS wirings and gate driver on array (GOA) wirings; and
the second bezel area is positioned on one side of the second curved section away from the planar section and provided with the VSS wirings.

10. A display device, comprising a flexible display panel having a display area, wherein the display area comprises a planar section and at least one corner splicing section positioned in a periphery of the planar section, and the corner splicing section surrounds a corner of the planar section; wherein the corner splicing section is provided with an opening hole penetrating through upper and lower surfaces of the flexible display panel, and the opening hole passes through the corner splicing section along a direction away from the planar section and is filled with a splicing element formed by a light guide material; and
the flexible display panel further comprises a light guide layer disposed on one side of a display surface of the flexible display panel and covering the display area.

11. The display device according to claim 10, wherein the flexible display panel comprises an array substrate and a plurality of light-emitting devices disposed on a surface of the array substrate facing the light guide layer; and
the light-emitting devices are disposed in the display area excluding the corner splicing section.

12. The display device according to claim 10, wherein the display area further comprises a first curved section and a second curved section positioned in the periphery of the planar section, and the first curved section and the second curved section are positioned on sides of the corner and respectively connected to the corner splicing section.

13. The display device according to claim 12, wherein the corner splicing section further comprises a first splicing subsection and a second splicing subsection, the first splicing subsection is positioned between the first curved section and the splicing element and connected to the first curved section, and the second splicing subsection is positioned between the second curved section and the splicing element and connected to the second curved section.

14. The display device according to claim 13, wherein the first splicing subsection is provided with VSS wirings, and the second splicing subsection is provided with the VSS wirings and gate driver on array (GOA) wirings.

15. The display device according to claim 12, wherein the flexible display panel further comprises a first bezel area and a second bezel area;
  the first bezel area is positioned on one side of the first curved section away from the planar section and provided with VSS wirings and gate driver on array (GOA) wirings; and
  the second bezel area is positioned on one side of the second curved section away from the planar section and provided with the VSS wirings.

16. The display device according to claim 10, further comprising a bonded substrate disposed on one side of the display panel facing away from the display surface and matching a shape of the flexible display panel;
  wherein the splicing element is in contact with a surface of the bonded substrate.

17. The display device according to claim 10, further comprising a cover plate disposed on one side of the light guide layer facing away from the flexible display panel and matching a shape of the flexible display panel.

18. The display device according to claim 17, further comprising a first optical adhesive layer disposed between the light guide layer and the cover plate and covering the light guide layer.

19. The display device according to claim 18, further comprising a touch control functional layer disposed between the first optical adhesive layer and the cover plate and covering the first optical adhesive layer.

20. The display device according to claim 19, further comprising a polarizing layer disposed between the touch control functional layer and the cover plate and covering the touch control functional layer.

* * * * *